United States Patent
Arnhold et al.

(10) Patent No.: US 11,291,128 B2
(45) Date of Patent: Mar. 29, 2022

(54) WELDED PRESSURE RELIEF DEVICE

(71) Applicant: R. Stahl Schaltgeräte GmbH, Waldenburg (DE)

(72) Inventors: Thorsten Arnhold, Pfedelbach (DE); Clife Hermanowski, Seckach (DE)

(73) Assignee: R. Stahl Schaltgeräte GmbH, Waldenburg (DE)

( * ) Notice: Subject to any disclaimer, the term of this patent is extended or adjusted under 35 U.S.C. 154(b) by 77 days.

(21) Appl. No.: 16/617,965

(22) PCT Filed: May 22, 2018

(86) PCT No.: PCT/EP2018/063336
§ 371 (c)(1),
(2) Date: Nov. 27, 2019

(87) PCT Pub. No.: WO2018/219711
PCT Pub. Date: Dec. 6, 2018

(65) Prior Publication Data
US 2020/0113071 A1   Apr. 9, 2020

(30) Foreign Application Priority Data

Jun. 1, 2017 (DE) .................. 10 2017 112 149.8
Oct. 4, 2017 (DE) .................. 10 2017 122 957.4

(51) Int. Cl.
*F41H 5/24* (2006.01)
*H05K 5/02* (2006.01)

(52) U.S. Cl.
CPC ......... *H05K 5/0213* (2013.01); *H05K 5/0217* (2013.01)

(58) Field of Classification Search
CPC . F41H 5/24; H02B 1/28; H05K 5/068; H05K 5/0213; A62C 4/00
See application file for complete search history.

(56) References Cited

U.S. PATENT DOCUMENTS

| 4,180,177 A | 12/1979 | Gunderman et al. |
| 6,202,472 B1 | 3/2001 | Wezurek et al. |
| 9,403,326 B2 | 8/2016 | Mann et al. |
| 2015/0036310 A1* | 2/2015 | Karandikar .......... H05K 5/0213 361/837 |
| 2015/0060445 A1* | 3/2015 | Mann ................. B23P 11/005 220/88.2 |
| 2018/0105282 A1* | 4/2018 | Tweet .................. A62C 4/00 |

FOREIGN PATENT DOCUMENTS

| CN | 101365632 A | 2/2009 |
| CN | 102496877 A | 6/2012 |
| CN | 204179508 U | 2/2015 |
| CN | 104427808 A | 3/2015 |
| CN | 106099740 A | 11/2016 |
| CN | 206040781 U | 3/2017 |
| DE | 1 041 449 B | 10/1958 |

(Continued)

*Primary Examiner* — J. Woodrow Eldred
(74) *Attorney, Agent, or Firm* — Blank Rome LLP (57) ABSTRACT

A pressure relief body sintered from a wire mesh and retained on an explosion-proof housing by welding. The corresponding welded seam has a fusion zone both on the pressure relief body and on the housing part and makes a mechanically robust and gas-tight joint between the two.

14 Claims, 4 Drawing Sheets

(56) References Cited

FOREIGN PATENT DOCUMENTS

| | | |
|---|---|---|
| DE | 1839 917 U | 10/1961 |
| DE | 91 17129 U1 | 4/1996 |
| DE | 10 2006 053 111 A1 | 5/2008 |
| DE | 20 2008 001 972 U1 | 7/2008 |
| DE | 10 2010 016 782 A1 | 11/2011 |
| DE | 10 2013 109 259 A1 | 3/2015 |
| DE | 10 2013 109 261 A1 | 3/2015 |
| DE | 10 2014 116 149 A1 | 5/2016 |

* cited by examiner

WELDED PRESSURE RELIEF DEVICE

CROSS-REFERENCE TO RELATED APPLICATIONS

This application is a national state of PCT/EP2018/063336 filed May 22, 2018 which claims priority to German Patent Application Nos. 10 2017 112 149.8, filed Jun. 1, 2017, and German Patent Application No. 10 2017 122 957.4, filed Oct. 4, 2017, the entirety of all of which are incorporated by reference herein.

TECHNICAL FIELD

The subject matter of the invention relates to a pressure relief device for an explosion-proof housing consistent with the construction of a "pressure-proof encapsulation" (ex-d) and a method for the manufacture of same.

BACKGROUND

Explosion-proof housings having the said construction are adapted for the accommodation of components, for example electrical and/or electronic components that may represent ignition sources for explosive gasses. If such gasses have entered the housing, pressure relief devices allow the reduction of excess pressure resulting from the deflagration in the housing, in which case they prevent the transmission of flame or burning particles in order to preclude an ignition of an explosive atmosphere existing outside the housing.

From publication U.S. Pat. No. 4,180,177 A, a pressure relief device disposed for this purpose can be inferred. The porous pressure relief body is gas-permeable and is held in a pressure compensation vent, clamped between annular flanges.

Likewise, publication DE 10 2010 016 782 A1 describes the mounting of a pressure relief body by clamping its annular peripheral zone between appropriate bearings and flanges. Furthermore, this publication describes the pore closure of the pressure relief body on its circumferential surface by means of plastic material that infiltrates and closes the pores of the circumferential surface. Materials such as plastic, metal, an elastomer or the like may be used for coating.

Furthermore, an explosion-proof housing of metal having a rectangular opening which is closed by a filter plate has been known from publication DE 1 041 449 A. The filter plate is tension-mounted by means of an also rectangular frame against the outer side of the housing in order to seal the rectangular opening. A metal mesh seal is arranged between the filter plate and the container.

Finally, publication DE 1 839 917 U discloses a flame arrester comprising a sintered metal body that is closed on one side and has the form of a hollow cylinder, for example. The sintered metal body is sintered to a solid extension piece of the same material, which, in turn is screwed to the housing.

Publication DE 10 2014 116 149 A1 recommends, as the pressure relief body for pressure relief devices, a body sintered of a larger number of wire fabric layers, in which case the wire fabric layers are adapted to each other in view of mesh size and arrangement in such a manner that a rigid gas-permeable, however flameproof body, is formed. In turn, this pressure relief body is arranged in a pressure compensation vent.

While the protection against flame transmission on the part of the pressure relief body is ensured as a result of its careful construction and corresponding manufacturing control, the flameproof mounting of the pressure relief body in or on a pressure compensation vent of a housing is a problem that requires special attention. Even after prolonged use, there must exist safety with respect to flame transmission; malfunctions must be reliably precluded.

SUMMARY

Considering this, it is the object of the invention to state a mass-produceable concept for mounting pressure relief bodies on pressure compensation vents of housings or housing components.

This object is achieved with the housing according to Claim 1, as well as with the method according to Claim 13:

Referring to the housing according to the invention, the pressure relief body is arranged on a pressure compensation vent and welded there to a housing component. Basically, this concept can be employed in all pressure relief bodies and housing components that are suitable for welding. In particular, this concept is suitable for pressure relief bodies and housing components of steel. Preferably, the pressure relief body is arranged on the interior of the housing and fastened there by one or more welded seams.

Preferably, the pressure relief body consists of several layers of superimposed wire netting. Preferably, these are connected to each other by sintering. Such a pressure relief body is rigid and, in unfinished condition, has open pores on both its flat surfaces, as well as on its circumferential surface. Preferably, the wire netting consists of a low-corrosion, e.g., rustproof steel, e.g., stainless steel.

In a preferred embodiment, this circumferential surface is configured as a smooth interface, in which case said interface may be provided with a fusion layer. The fusion layer may be formed by melting the circumferential surface and/or by applying a filler material, for example used in the course of a welding process. The fusion layer may be formed by a weld penetration zone which is formed due to the planar effect of heat. The exposure to heat preferably occurs locally and in a controlled manner, for example, by means of an electric arc, a laser beam or another locally effective energy source that is progressively moved over the circumferential surface. In doing so, the preferred method is a laser powder welding process, wherein a metal powder is melt-deposited by means of a laser beam with the use a shielding gas. The filler material that is in particular suitable for joint-welding and build-up welding is a metal powder such as, for example a powder of steel grade 1.4430.

Preferably, the fusion layer takes up the entire circumferential surface of the pressure relief body or also only parts thereof. Said fusion layer is adapted to close the pores and, additionally, to mechanically fix the wire mesh layers of the pressure relief body that have been bonded to each other by sintering. In principle, this concept can however also be used in pressure relief bodies which consist of other porous materials, for example of bodies or spheres that have been sintered to each other. The fusion of the circumferential surface and the coating with aggregate material may take place in one or more revolutions of a weld head around the pressure relief body, in which case the fusion of the periphery of the pressure relief body and a fillet weld are produced, one after the other, in order to connect the pressure relief body and the housing (or vice versa).

In a preferred embodiment the pressure relief body is supported (inside and/or outside) by the periphery of the housing component enclosing the pressure compensation vent, and is welded there to the latter by means of an uninterrupted welded seam extending along the entire circumference of the pressure relief body. The housing component may be the housing wall itself or a separate support that is welded to the pressure relief body and connected to the housing wall. In turn, the housing component itself may be welded, glued or screwed to the housing wall, or molded into the housing wall, e.g., cast into the latter.

Independent of whether or not the pressure relief body is directly connected to the housing wall or connected to the housing component that is configured as the support, the pressure relief body may be arranged inside the housing or, alternatively outside the housing. It is also possible to arrange one pressure relief body each on the inside as well as on the outside of the housing or housing component. It is further possible to arrange the pressure relief body in the pressure compensation vent. Fastening is achieved in each case by welding, preferably with an uninterrupted welded seam extending around the outer circumferential surface and/or the circumference of the pressure compensation vent.

In addition to the welded connection, sealing materials such as glue, elastomer, plastic or the like or other seals, e.g., of metal mesh or metal fabric, can be arranged between the respective flat surface of the pressure relief body and the periphery of the housing part enclosing the pressure compensation vent.

Furthermore, it is possible to provide, in the pressure relief body, one or more openings which are positioned in the peripheral zone surrounding the pressure relief opening and which are filled with welding material while the pressure relief vent is fastened to the housing component. This type of fastening is also referred to as plug welding or slot welding. A welded seam extending all around the outside along the circumferential surface may be omitted, or such a welded seam may be additionally applied. Furthermore, the circumferential surface may optionally be subjected to fusion. Also, optionally, a plastic sealing material may be arranged between the pressure relief body and the housing component.

In the housing of each of the types of construction described herein, the pressure compensation vent may be divided—independently of whether the pressure relief body is arranged on the outside of the housing or in the interior space of the housing on the wall inside—by wall bars into several partial openings. This measure contributes to the improvement of the distribution of the out-flowing gas over the surface of the pressure relief body. The thermal input into the pressure relief body is distributed over a large portion of its surface, as a result of which the pressure reduction to be achieved by gas cooling increases again.

Instead of the wall bars or in addition to them, bar-shaped pressing zones for dividing the gas flow in or on the pressure relief body may also be provided, which pressing zones extend, for example, from one location on the periphery of the pressure relief body up to another, opposite, location on the periphery. The pressing zones are plastically deformed portions, in which the thickness of the pressure relief body is reduced. Several intersecting pressing zones may be provided. In the pressing zones, the pore volume is reduced or eliminated, so that the flow permeability of these zones compared to the uncompressed portions is reduced to such an extent that the pressure relief flow is concentrated along the uncompressed portions.

In the case of each housing described herein, the pressure relief body adjoining the circumferential surface may preferably be configured as a smooth interface, be provided all around with a plastically deformed and thus compressed pressing zone, in which the pore volume is reduced or eliminated. In particular, it is possible as a result of this to reduce the volume of the welded seam to be produced and also improve the weldability of the pressure relief body. Preferably, the pressing zone extends around the entire circumference of the pressure relief body. Furthermore, the width of the bar-shaped compressed portion is preferably at least as great as the thickness of the pressure relief body.

BRIEF DESCRIPTION OF THE DRAWINGS

Additional details of advantageous embodiments of the invention are the subject matter of the description, the claims or the drawings. They show in FIG. 1 a schematic perspective representation of a housing according to the invention, FIG. 2 an even more schematic exploded view of the housing as in FIG. 1, FIG. 3 a detail of a sectional view of the interface between the pressure relief body and the housing component of the housing as in FIG. 1, FIG. 4 an alternative embodiment of fastening the pressure relief body to the housing component, FIGS. 5 to 7 details of longitudinal sectional representations of additional alternative embodiments of fastening the pressure relief body to the housing component, FIG. 8 a schematic perspective representation of a housing with a pressure relief body that is held by plug welding, FIG. 9 an exploded view of the housing as in FIG. 8, FIG. 10 a detail of a sectional representation of the connecting location between the pressure relief body and the housing component of the housing similar to FIG. 1, with the peripherally compressed pressure relief body, and FIG. 11 the housing similar to FIG. 1, with the pressure relief body and the flow dividing screen located on the inside.

DETAILED DESCRIPTION

Figure 1:
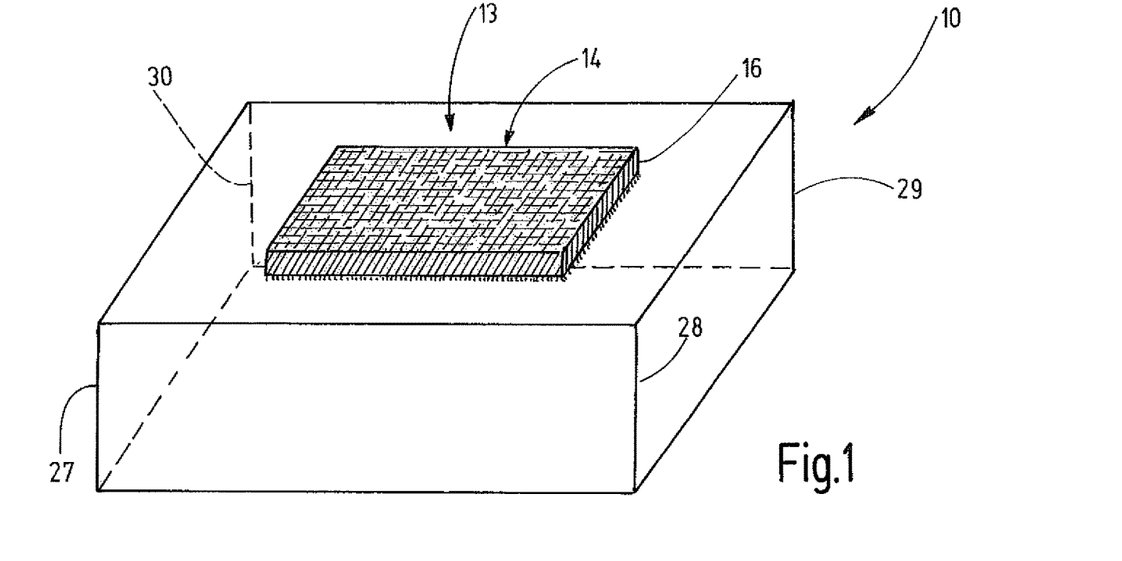

FIG. 1 shows an explosion-proof housing 10 consistent with the type of construction of a "pressure-proof encapsulation" (ex-d). Said housing encloses an interior space 11, in which not specifically illustrated electrical and/or electronic parts or components can be arranged, which parts or components may represent ignition sources for an explosive gas mixture existing outside the housing.

The housing 10 has a wall consisting, e.g., of sheet metal, in particular sheet steel, or also of a cast material, e.g., cast aluminum, in which wall there is provided at least one pressure compensation vent 12, in or on which pressure compensation vent there is arranged one pressure relief body 13. This pressure relief body is preferably a plate-shaped, flat sintered body having a first outward-facing flat surface 14 and second flat surface 15 facing the interior space 11. Each of the two flat surfaces 14, 15 takes up the entire area of the pressure compensation vent 12 and has—on its entire surface—openings of channels that are flame-propagation-proof and extend through the pressure relief body 13. Preferably, the pressure relief body 13 is formed by planar layers of metal fabric which are connected to each other by welding or by sintering. Preferably, the metal fabric is fabricated of stainless steel wires. The sintered body has a circumferential surface 16 all around it, said circumferential surface 16 connecting the two flat surfaces 14, 15 to each other. The circumferential surface 16 may be configured as a surface with flat sections and being oriented at a right angle with respect to the flat surfaces 14, 15. Alternatively, the circumferential surface 16 may be oriented at an inclination relative to the flat surfaces 14, 15. Referring to this and all the other embodiments, the pressure relief body may be rectangular, square, otherwise polygonally delimited or round, e.g., configured as a circular disk.

Figure 2:
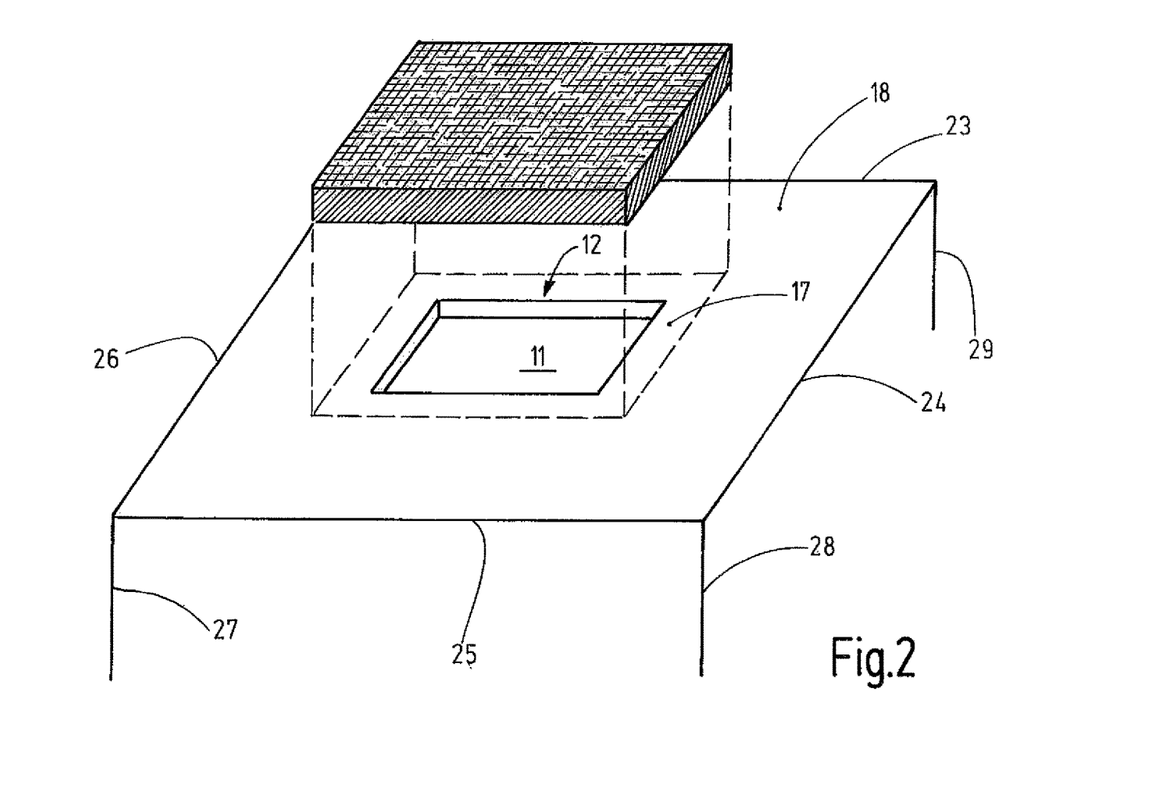

Preferably, the pressure relief body 13 has the same shape as the pressure compensation vent 12; however, the pressure relief body is larger than the pressure compensation vent (in conjunction with this, see FIG. 2, in particular). Therefore, the pressure compensation vent 12 is surrounded by a peripheral zone 17, by which the pressure relief body 13 is supported in installed state. The peripheral zone 17 is a flat, preferably planar zone, of a housing component 18 that may be formed by a support part or by the housing wall itself. Preferably, the housing component 18 is made of a weldable material, in particular steel, preferably sheet steel. FIGS. 1, 2, 3, 8 and 9 show the pressure relief body 13 mounted to the outside of the housing 10. However, it may likewise be installed on the inside of the pressure compensation vent. In this event, the description hereinafter applies analogously.

In the exemplary embodiment of the housing 10 according to the invention as illustrated by FIGS. 1 and 2, the pressure relief body 13 is mounted to the outside of said housing. The flat surface 15 is supported by the peripheral zone 17 of the housing component 18 (i.e., the housing wall or another flat support element) and is materially bonded thereto. To do so, there may be provided a welded seam 19 that is formed, for example, as a fillet weld between the circumferential surface 16 and the outside of the housing component 18. The welded seam 19 may display the same or different weld penetration on the pressure relief body 13 and on the housing component 18. Preferably, the welded seam 19 is produced with the aid of a welding filler material, typically steel powder or also steel wire. However, it is also possible to use welding processes without filler material such as, for example, laser welding, or welding processes with filler material such as, for example, laser powder build-up welding processes, with or without shielding gas.

Figure 3:
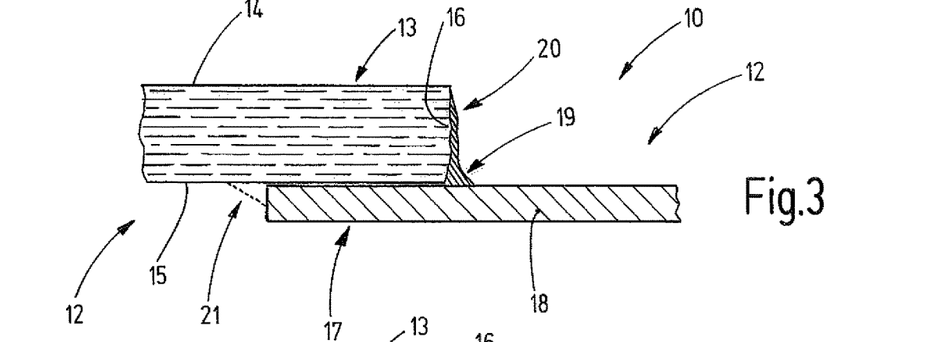

In the exemplary embodiments shown by FIG. 3 and all other exemplary embodiments, it is possible to provide all or only parts of the circumferential surface 16 with a fusion layer 20 in order to close any pores of the pressure relief body 13 that exist there. The fusion layer 20 may be produced by melting the circumferential surface 16 by suitable exposure to energy, for example by means of an electric arc, a laser beam, plasma beam or the like, with or without the aid of a filler material. In doing so, a superficial melting pool is formed due to the local exposure to energy, which pool then moves, due to the relief movement between the steel and the pressure relief body, in one or more revolutions along the circumferential surface in order to fully or partially provide said surface with the fusion layer. In doing so, zones of the flat surfaces 14, 15 of the pressure relief body close to the peripheral zone may also be included.

In the exemplary embodiment according to FIG. 3, the fusion layer 20 leaves open a small section of the circumferential surface 16. However, it is preferred that the fusion layer 20 be formed on the entire peripheral surface 16 and will, optionally additionally, extend to smaller portions of the flat surfaces 14, 15 that are closer to the peripheral zone. The welded seam 19 may be formed between the pressure relief body 13 and the housing component 18, after the fusion layer 20 has been formed. However, it is also possible to form the fusion layer 20 and the welded seam 19 at the same time, for example by means of an appropriately moved laser beam.

According to FIG. 3, the pressure relief body 13 is supported by the peripheral zone 17, without any additional connection to the housing component 18. However, optionally, it is also possible to provide an additional welded seam on the pressure compensation vent 12, i.e., its edge, in order to improve the connection between the pressure relief body 13 and the housing component 18. This welded seam 21 may be formed as a fillet weld between the flat surface 15 and the edging of the pressure compensation vent—with or without filler material—by means of a suitable welding process. Furthermore, it is alternatively possible for the welded seam 29 to replace the welded seam 21. At least one of the two welded seams 19, 21 has the form of a closed ring.

In the so far described embodiments, the welding processes that can be used are MiG welding, MAG welding, WIG welding, manual arc welding, laser welding without filler material, laser welding with filler material, submerged arc welding, electron beam welding, plasma welding or other suitable welding processes. Welding processes are considered to be all material-bonding connecting processes, wherein a welded seam is formed, which features a weld penetration, i.e., a fusion region, on the housing component 18, as well as on the pressure relief body 13.

Figures 4, 5:
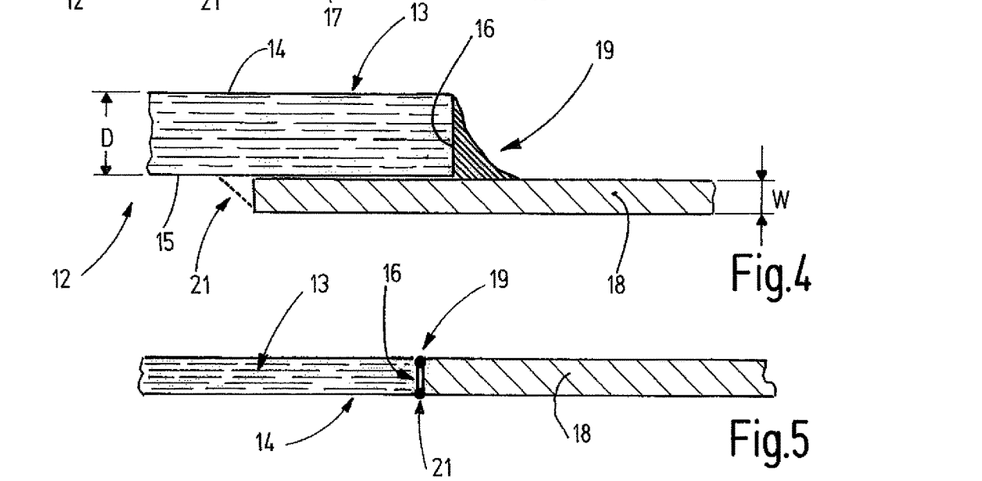

FIG. 4 shows a modified embodiment of the housing 10 according to the invention. The description hereinabove applies also to this embodiment, using as basis the already introduced reference signs. However, different from the exemplary embodiment described hereinabove, the fillet weld 19 is formed in such a manner that it takes up at least a large part, preferably the entire height, of the circumferential surface 16. Consequently, the fillet weld 19 provides a seal on the periphery of the pressure relief body 13, and also results in the fastening of said pressure relief body. In addition to or as an alternative to the fillet weld 10, it is again possible to provide a welded seam 21 adjoining the flat surface 15. At least one of the two welded seams 19, 21 is configured so as to form a closed ring.

In the case of the embodiment of the invention described hereinafter and all of those described hereinabove, the thickness D of the pressure relief body to be measured between the flat surfaces 14, 15 may deviate from the thickness W of the housing wall. In particular, the thickness D of the pressure relief body 13 may be greater than the thickness W of the housing component 18. The flexural rigidity of the pressure relief body 13 may be different from the flexural rigidity of the housing component 18 and/or the housing wall. In particular, it is possible for the flexural rigidity of the pressure relief body 13 to be greater than that of the housing component 18 and/or the housing wall. In these cases, the welded seam 19 or the welded seam 21 is able to allow relative micromovements between the pressure relief body 13 and the housing wall, which micromovements would be due to an explosion occurring in a housing. In this case, the welded seam 19 or 21 may act in the manner of a hinge that allows at least minimal relative angular movements.

Whereas the embodiments of the invention described so far consider as premise that the pressure relief body 13 be attached to the outside of the housing 10, reference is again made here to the fact that the pressure relief body 13 may also be arranged in the pressure compensation vent 12 or inside the interior space 11, i.e., behind the pressure compensation vent 12—viewed from the outside. This has the advantage that, in the event of an explosion, the pressure relief body 13 is pressed toward the housing wall and thus held in a positive lock by said housing wall.

Reference is now made to FIG. 5. In that figure, the pressure relief body 13 has an exemplary thickness D which corresponds to the thickness W of the housing. Again, the pressure relief body is connected to the housing component 18 by one or two welded seams 19, 21, at least one of these extending around the entire circumference of the pressure relief body. The welded seams 19, 21 may be butt welds that have been produced—with or without filler material—by means of one of the aforementioned welding processes and be confined, as illustrated, to the upper and lower peripheries of the pressure compensation vent. However, it is also possible to provide—between the pressure relief body 13 and the circumference of the pressure compensation vent 12—a butt weld that takes up the entire circumferential surface 16. This is possible, for example, with laser welding. Furthermore, the pressure relief body 13 may have a thickness that more or less deviates from the thickness of the housing component 18. The pressure relief body can be arranged so as to be centered, so that is center plane located in the center between the two flat surfaces 14, 15 coincides with the center plane of the housing component 18. Alternatively, it may also be arranged off-center, so that its center plane is located at a distance from the center plane of the housing component.

Figure 6:
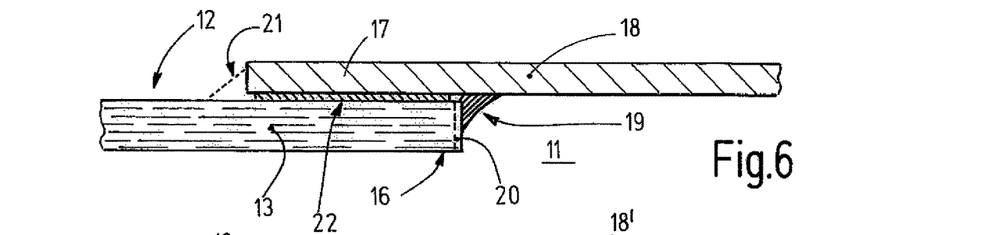

FIG. 6 illustrates an embodiment with the pressure relief body 13 fastened in the interior space 11, so that the pressure relief body 13 extends behind the peripheral zone 17 of the pressure compensation vent 12. Optionally, the circumferential surface 16 may be provided with a fusion layer 20. For a gas-tight and mechanically firm connection between the pressure relief body 13 and the housing part 18, the welded seam 19 extending all around the circumferential surface 16 and/or the welded seam 21 extending all around the periphery of the pressure compensation vent 12 may be provided. As in all other exemplary embodiments, at least one of the welded seams 19 and 21 is configured without interruptions, so that it forms a closed ring.

The exemplary embodiment of FIG. 6 also illustrates that a seal 22 may be arranged between the pressure relief body 13 and the peripheral zone 17 of the housing part 18. This seal may be a formless mass such as an adhesive, elastomer or the like, or also have the defined form of a body such as, for example, a rubber interlayer or an interlayer of a suitable gasket material. Such a seal 22 may be provided in any of the described embodiments with the exception of the embodiment according to FIG. 5.

Figure 7:
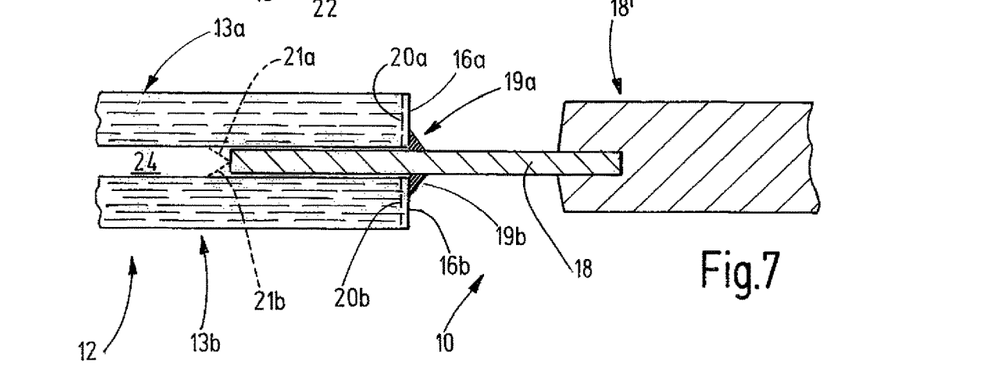

In each of the embodiments described hereinabove, the pressure relief body 13 may be welded directly to the housing wall or only be welded to a housing component 18 that, accordingly, preferably consists of sheet metal, which, in turn, is connected to the housing wall. FIG. 7 shows this with reference to the example of a housing wall 18' produced by means of a casting process, for example aluminum casting, into which housing wall a flat annular support is cast, said support forming the housing component 18. This support encloses the pressure compensation vent 12 in an annular manner and may be connected to the pressure relief body 13 consistent with each of the ways described hereinabove. The cast wall may extend up to the pressure relief body 13a and/or 13b or, as shown, maintain a distance therefrom.

Basically, it is however also possible to fasten a pressure relief body 13 to a pressure compensation vent 12, as well as on the outside or on the inside, in which case, to do so, each of the structures and methods illustrated in FIGS. 3, 4 and 6 can be used and combined with each other as desired. This is independent of whether the housing component 18 is a support cast into the housing wall 18' as depicted by FIG. 7, or whether the housing component 18 itself acts the housing wall.

If, as illustrated by FIG. 7, respectively one pressure relief body 13a, 13b is arranged on each of the two sides of the housing component 18, a diffusion space 24 is defined between the two pressure relief bodies 13a, 13b, which diffusion space results in an equalization of the gas flow through the two pressure relief bodies 13a, 13b. This can lead to a particularly effective reduction of pressure peaks in the housing 10.

If the two pressure relief bodies 13a, 13b are provided together on a pressure compensation vent 12, both can be held by fillet welds 19a, 19b, at the circumferential surfaces 16a, 16b, on the housing component 18. The fillet welds 19a, 19b may completely or partially take up the circumferential surfaces 16a, 16b. Fusion layers 20a, 20b may be provided on the circumferential surfaces 16a, 16b of at least one of the pressure relief bodies 13a, 13b. Asymmetrical solutions are also possible; in these cases, only one of the pressure relief bodies 13a, 13b is fixed with one outer fillet weld 19a or 19b—respectively under the other—to an inner fillet weld 21a or 21b. Also, in the event of such a solution, again, at least one of the pressure relief bodies 13a, 13b may be provided—on its circumference—with a fusion layer 20a, 20b. It is also possible to provide additional sealing measures, for example in the form of seals consistent with the type of seal 22 as in FIG. 6.

Figure 8:
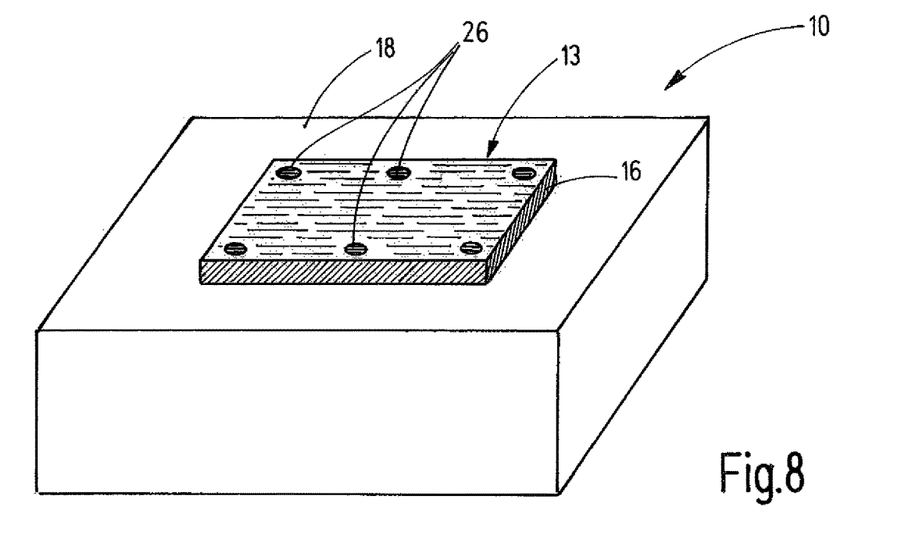
Figure 9:
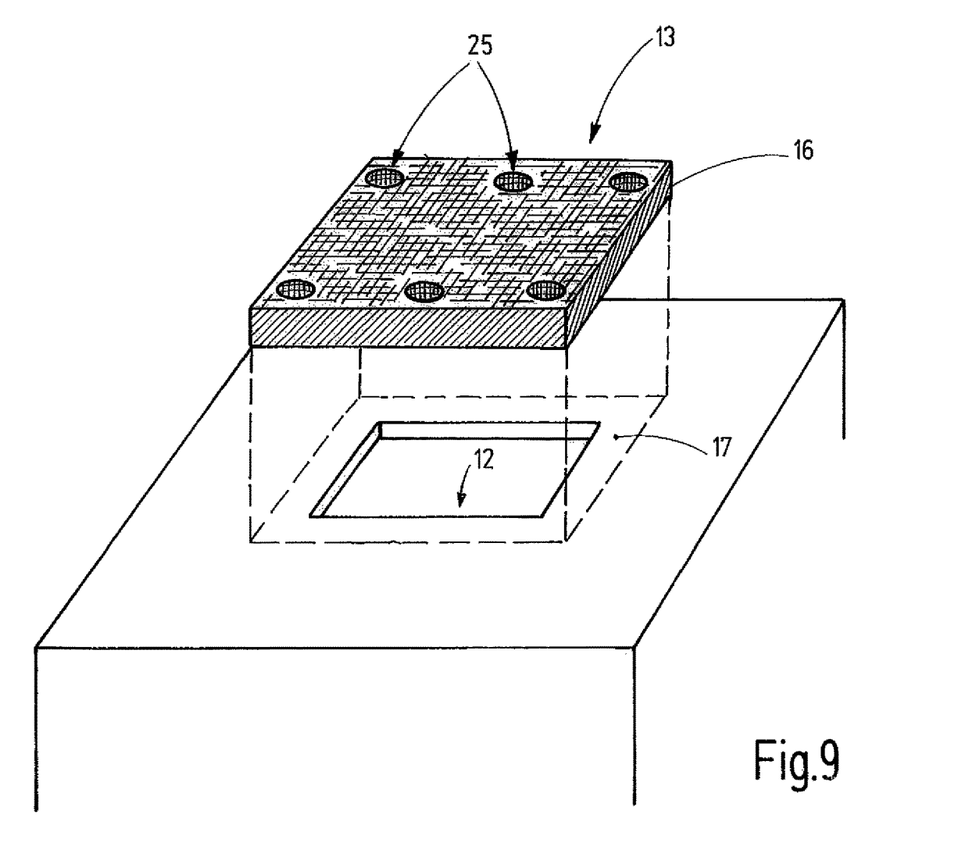

Whereas in all the embodiments hereinabove the welded seams 19 and 21 extend either all the way around the outer circumferential surface 15 of the pressure relief body 13, or, in the case of the welded seam 21, along the periphery of the pressure compensation vent 12, alternative embodiments are possible, as illustrated by FIGS. 8 and 9. The pressure relief body 13 shown there has several openings 25 that lead to the peripheral zone 17 when the pressure relief body 13 is placed on the pressure compensation vent 12. The cutouts may be filled with welding filler materials, in which case the thusly formed welded joint connects the peripheral zone 17 to the pressure relief body 13. The circumferential surfaces 16 of the pressure relief body 13 may remain open or, be provided with a fusion layer 20 in accordance with any of the methods mentioned hereinabove. The pressure relief body 13 which is connected to the housing component 18 consistent with this concept may be arranged on the outside of the housing 10 as depicted by FIG. 8 or also in the interior space of the housing 10 and be connected from the inside to the peripheral zone 17 of the housing component 18. Furthermore, the housing component 18 may be the housing wall itself or a support connected thereto. For an additional seal between the housing component 18 and the pressure relief body 13, the outer circumferential surface 16 may be connected to the housing component 18 via a fillet weld. Additionally or alternatively, a welded seam may be provided, which welded seam connects the periphery of the pressure compensation vent 12 to the facing flat surface 15 all around the pressure compensation vent 12.

In all embodiments, the pressure relief body 13 may be fastened to the housing wall as a flat metal sheet, before the housing component 18 is being shaped. To do so, the pressure relief body 13 is fastened to a flat metal sheet which is provided with the pressure compensation vent 12, whereafter the metal sheet is angled at the specified bending lines 23-26 (see FIG. 2) and the housing edges 27-30 are preferably welded together by means of the same welding process that is also used for fastening the pressure relief body 13 to the housing 18.

Figure 10:
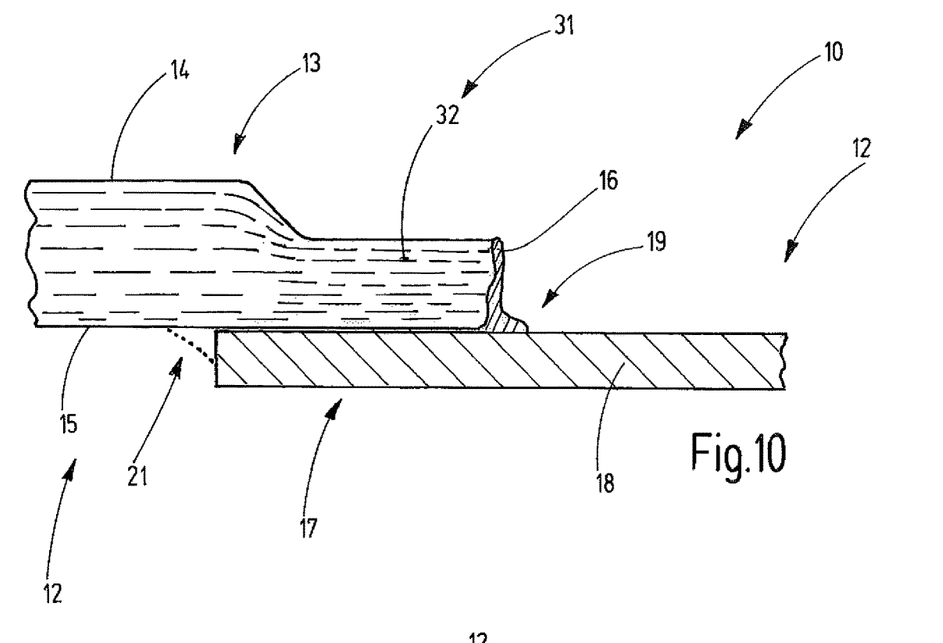

In all embodiments described hereinabove and hereinafter, the pressure relief body 13 may feature a modification that is illustrated on the example of the embodiment according to FIG. 10. The pressure relief body 13 may have on its periphery 31—which preferably directly adjoins the outer circumferential surface 16—a compression zone 32, in which the pressure relief body 13 is compressed, so that the existing pore volume is clearly reduced or eliminated. The plastic deformation for producing the compression zone 32 may, for example, occur by means of a cold-deformation process in cold state of the pressure relief body 13 consisting of the sintered wire mesh. It is also possible to perform the compression of the pressure relief body 13 with the application of heat before or during compression, i.e., at least in the region that is to be compressed. As shown by FIG. 10, the compression may occur on one side, so that the flat surface 15 is completely flat and the flat surface 14 is provided with a step. It is also possible to distribute the step, which results from the thickness reduction of the pressure relief body 13 on its periphery 31, over both flat surfaces 14, 15.

The compressed periphery 31 may have a width that is less than the width of the peripheral region 17, in which case the pressure relief body 13—as indicated in FIG. 1—may be welded to the housing. However, said pressure relief body can also be inserted in the pressure compensation vent 12 in accordance with FIG. 5 or be fastened to the interior side of the housing component 18 in accordance with FIG. 6. It is also possible to provide one or two such pressure relief bodies—like the pressure relief bodies 13a, 13b according to FIG. 7—on one or both sides on a housing component 18, which, in turn is fastened to a housing wall, for example corresponding to FIG. 7, by being cast into a housing wall 18'.

Figure 11:
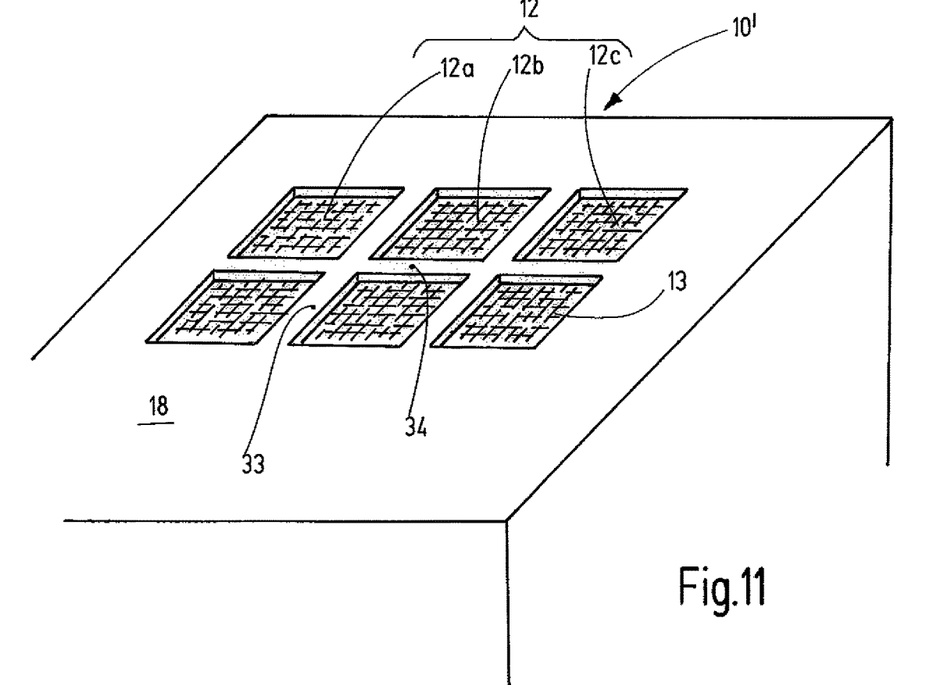

FIG. 11 shows another modification of the housing according to the invention as housing 10', the special feature of which is that the pressure compensation vent 12 is divided into partial vents 12a, 12b, 12c, etc. The division of the pressure compensation vent 12 into partial vents 12a, b, c, etc., is done by wall bars 33, 34. Preferably, these are an integral part of the housing component 18, in which case they preferably form a regular grid. The pressure relief body 13 preferably covers all partial vents 12a, 12b, 12c, etc. Alternatively, however, it is also possible to provide respectively two or more pressure relief bodies, each of which covering one or more of the partial vents and being welded accordingly to the wall bars 33, 34. However, in the preferred embodiment, only a single pressure relief body 13 is provided, which pressure relief body bridges all partial vents 12a, 12b, 12c, etc. and is welded to the housing wall of the housing part 18 only on its circumference around all partial vents 12a, b, c, etc. With the use of the grid produced by the wall bars 33, 34, a pressure relief flow is divided into partial flows, which causes the thermal input into the pressure relief body 13 to be distributed over a larger area, and thus the effectiveness of the pressure relief body 13 is increased in order to reduce the pressure.

A grid formed by the wall bars 33, 34 can also be formed on the housing component 18 according to FIG. 7, in which case it is then located between the two pressure relief bodies 13, 13b. Likewise, this may also be done in the embodiments according to FIGS. 1 to 4, as well as 8 and 9.

It is pointed out that the pressure relief body 13 in all embodiments described hereinabove can also be connected to the housing component 18 in ways other than the weld joint, for example by gluing or also soldering, in particular hard soldering (furnace brazing or the like). Furthermore, it is possible to support the material-bonded connection by positive-locking connections, for example by screw connections, clamping connections or the like. For example, it is possible to provide screws in the compression zone 32, if any, on the periphery of the pressure relief body 13, which screws effect—in addition to the material-bonded connection such as an adhesive connection—a positive-locking securing of the pressure relief body 13 on the housing component 18.

A pressure relief body 13 sintered from wire mesh is held on an explosion-proof housing by welding. The corresponding welded seam 19 and/or 21 has a fusion zone both on the pressure relief body 13 and on the housing component 18 and connects both in a mechanically firm and gas-tight manner.

REFERENCE SIGNS

| | |
|---|---|
| 10, 10' | Housing |
| 11 | Interior space |
| 12 | Pressure compensation vent |
| 13, 13a, 13b | Pressure relief body |
| 14 | Flat outer surface of the pressure relief body 13 |
| 15 | Flat inner surface of the pressure relief body 13 |
| 16 | Outer circumferential surface of the pressure relief body 13 |
| 17 | Peripheral zone |
| 18 | Housing component |
| 18' | Housing wall (e.g., aluminum cast) |
| 19 | Welded seam |
| 20 | Fusion layer |
| 21 | Welded seam |
| 22 | Seal |
| 23-26 | Bending lines |
| 27-30 | Housing edges |
| 31 | Periphery of the pressure relief body 13 |
| 32 | Compression zone |
| 33, 34 | Wall bars |

The invention claimed is:

1. An explosion-proof housing consistent with the construction of "pressure-proof encapsulation" (ex-d),
    wherein the explosion-proof housing encloses an interior space configured to accommodate electrical components capable of forming ignition sources, and that comprises a housing component on which a pressure compensation vent is formed,
    with at least one pressure relief body that has two flat surfaces which face away from each other, and that has one circumferential surface which connects the flat surfaces, and that is arranged on the pressure compensation vent,
    wherein the circumferential surface is configured as a fusion layer formed by a welded seam, said fusion layer extending from one of the flat surfaces to the other flat surface,
    wherein the fusion layer extends along the entire circumferential surface of the pressure relief body, completely covering said circumferential surface, and
    wherein the pressure relief body is welded to the housing component.

2. The explosion-proof housing according to claim 1, wherein the pressure relief body is a wire mesh sintered body which consists of several wire mesh layers connected to each other by sintering.

3. The explosion-proof housing according to claim 1, wherein the pressure relief body is provided adjoining the circumferential surface, which is preferably configured as a smooth interface with a pressing zone extending all around, in which pressing zone the pore volume is reduced or eliminated.

4. The explosion-proof housing according to claim 1, wherein the flat surfaces of the pressure relief body are configured so as to be planar.

5. The explosion-proof housing according to claim 1, wherein both the pressure relief body and the pressure compensation vent have a rectangular contour, in which case the contour of the pressure relief body is larger than the contour of the pressure compensation vent.

6. The explosion-proof housing according to claim 1, wherein the pressure compensation vent is divided by wall bars into several partial vents.

7. The explosion-proof housing according to claim 1, wherein the pressure relief body is connected to the housing component via a welded seam.

8. The explosion-proof housing according claim 1, wherein the pressure relief body has one or more passages, at which the pressure relief body is welded to the housing component.

9. The explosion-proof housing according to claim 1, wherein the pressure relief body is arranged so as to be supported by a peripheral zone which surrounds the housing component.

10. The explosion-proof housing according to claim 1, wherein the circumferential surface of the pressure relief body is exposed to surrounding atmosphere or the interior space.

11. A method for the manufacture of an explosion-proof housing, said method comprising:
providing a housing that encloses an interior space configured to accommodate electrical components capable of forming ignition sources, and that comprises a housing component on which a pressure compensation vent is formed;
providing at least one pressure relief body that has two flat surfaces which face away from each other, and that has one circumferential surface which connects the flat surfaces;
arranging the pressure relief body on the pressure compensation vent; and
welding the pressure relief body to the housing component,
wherein the circumferential surface is configured as a fusion layer formed by a welded seam, said fusion layer extending from one of the flat surfaces to the other flat surface, and
wherein the fusion layer extends along the entire circumferential surface of the pressure relief body, completely covering said circumferential surface.

12. The method according to claim 11, wherein the pressure relief body is subjected to fusion on its circumferential surface in order to close pores.

13. The method according to claim 11, wherein the welded seam disposed for the connection of the pressure relief body is formed continuously and/or in openings along the entire circumferential surface.

14. The method according to claim 11, wherein the circumferential surface of the pressure relief body is exposed to surrounding atmosphere or the interior space.

* * * * *